US006564987B2

(12) United States Patent
Imai et al.

(10) Patent No.: US 6,564,987 B2
(45) Date of Patent: May 20, 2003

(54) METHOD, APPARATUS AND COMPUTER READABLE MEDIUM FOR EVALUATING CONFIGURATION OF SOLDER EXTERNAL TERMINALS OF A SEMICONDUCTOR DEVICE

(75) Inventors: Kanako Imai, Kawasaki (JP); Nobutaka Ito, Kawasaki (JP); Fumihiko Ando, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/811,573

(22) Filed: Mar. 20, 2001

(65) Prior Publication Data

US 2002/0084308 A1 Jul. 4, 2002

(30) Foreign Application Priority Data

Nov. 16, 2000 (JP) .......................... 2000-350221

(51) Int. Cl.[7] .................. B23K 31/12; B23K 31/02; B23K 31/00; H01L 21/50
(52) U.S. Cl. ................. 228/103; 228/102; 228/104; 228/180.22; 228/180.21; 438/106; 438/108
(58) Field of Search ................... 228/102–104, 228/180.22, 180.21, 256, 246; 438/106, 108

(56) References Cited

U.S. PATENT DOCUMENTS

| | | | | | |
|---|---|---|---|---|---|
| 4,930,890 A | * | 6/1990 | Hara et al. | ................. | 356/241.1 |
| 5,058,178 A | * | 10/1991 | Ray | ............................. | 438/121 |
| 5,184,516 A | * | 2/1993 | Blazic et al. | ................. | 438/121 |
| 5,621,811 A | * | 4/1997 | Roder et al. | ................. | 348/126 |
| 5,711,989 A | * | 1/1998 | Ciardella et al. | ...... | 228/180.22 |
| 5,761,337 A | * | 6/1998 | Nishimura et al. | ......... | 257/642 |
| 5,815,275 A | * | 9/1998 | Svetkoff et al. | ............. | 356/608 |
| 5,827,951 A | * | 10/1998 | Yost et al. | ................... | 257/506 |
| 5,843,808 A | * | 12/1998 | Karnezos | ..................... | 438/121 |
| 5,862,973 A | * | 1/1999 | Wasserman | ................. | 228/103 |
| 5,882,720 A | * | 3/1999 | Legault et al. | ............. | 228/102 |
| 5,902,495 A | * | 5/1999 | Burke et al. | ............. | 219/85.19 |
| 6,118,540 A | * | 9/2000 | Roy et al. | ................... | 228/102 |
| 6,122,177 A | * | 9/2000 | Kitano et al. | .......... | 228/180.22 |
| 6,151,406 A | * | 11/2000 | Chang et al. | ............ | 356/241.1 |
| 6,173,070 B1 | * | 1/2001 | Michael et al. | ............. | 382/145 |
| 6,279,226 B1 | * | 8/2001 | Ohkubo et al. | .......... | 228/180.5 |
| 6,326,698 B1 | * | 12/2001 | Akram | ....................... | 257/642 |
| 6,337,122 B1 | * | 1/2002 | Grigg et al. | ................. | 257/506 |
| 6,359,367 B1 | * | 3/2002 | Sumanaweera et al. | ..... | 310/306 |
| 6,373,273 B2 | * | 4/2002 | Akram et al. | ............... | 310/306 |
| 6,457,634 B2 | * | 10/2002 | Nagata | ....................... | 228/256 |
| 6,496,270 B1 | * | 12/2002 | Kelley et al. | ............... | 257/506 |

* cited by examiner

*Primary Examiner*—Tom Dunn
*Assistant Examiner*—L. Edmondson
(74) *Attorney, Agent, or Firm*—Armstrong, Westerman & Hattori, LLP

(57) ABSTRACT

A method of evaluating configuration of solder external terminals of a BGA-type tape-based semiconductor device mounted on a board such that the external terminals are joined to lands provided on the mounting board is provided. The method includes the step of obtaining geometric data related to opening of a tape substrate of the semiconductor device, solder balls to be placed at positions corresponding to the openings, and the lands of the mounting board and the step of deribing configuration of the solder external terminal based on the geometric date. The method further includes the step of calculating the volume of voids to be produced in the external terminals, so as to compensate for the geometric data related to the tape substrate.

14 Claims, 11 Drawing Sheets

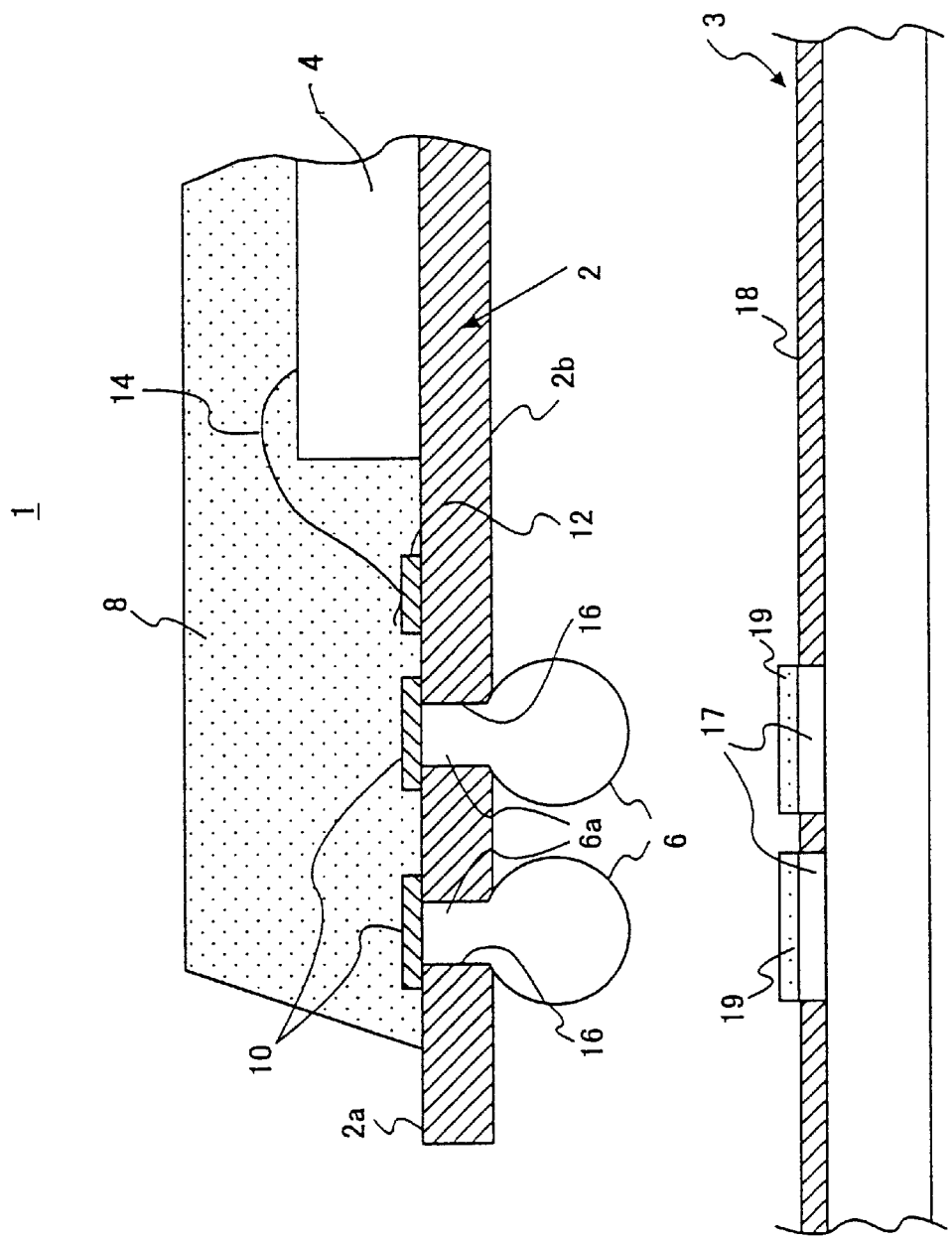

FIG.9

| GRADE | T1/T2 | OCCURRENCE OF FAILURE |
|---|---|---|
| AA | $1.0 \leq T1/T2$ | NO FAILURE |
| A | $0.7 \leq T1/T2 < 1.0$ | POSSIBLE FAILURE |
| B | $0.5 \leq T1/T2 < 0.7$ | FAILURE OF SEVERAL ppm |
| C | $0.3 \leq T1/T2 < 0.5$ | FAILURE |
| D | $T1/T2 < 0.3$ | FREQUENT FAILURE |

METHOD, APPARATUS AND COMPUTER READABLE MEDIUM FOR EVALUATING CONFIGURATION OF SOLDER EXTERNAL TERMINALS OF A SEMICONDUCTOR DEVICE

BACKGROUND OF THE INVENTION

1. Field of the Invention

The present invention generally related to a method of evaluating configuration of solder external terminals of semiconductor device, and particularly relates to evaluation of failures of configuration of solder external terminals of a BGA (Ball Grid Array) semiconductor device after secondary mounting process.

2. Description of the Related Art

Recently, a semiconductor device is required to have a package structure that can achieve higher density, higher speed and higher power at a low cost. An FBGA (Fine pitch Ball Grid Array) type semiconductor device having a fine-patched structure has been developed to meet such requirements. The FBGA type semiconductor device are now used in various types of electronic equipment. There are some FBGA type semiconductor devices provided with tape substrates to achieve a further fine-pitched structure. Such fine-pitched semiconductor devices must also be mounted on mounting boards with high reliability.

One method of evaluating the reliability is to estimate the configuration of ball-shaped solder external terminals. In the estimation, the configuration of the solder external terminal is estimated for a state after the semiconductor device has been mounted on the mounting board. When the solder external terminals are arranged in a fine pitched structure, it becomes difficult to estimate the configuration of the solder external terminals. Accordingly, there is a need for a simple and accurate method of evaluating the configuration of the solder external terminals.

FIG. 1 is a schematic diagram showing a semiconductor device 1 having a package structure of a FBGA type. The semiconductor device 1 generally comprises a tape 2, a semiconductor chip 4, ball-shape solder external terminals 6 and a sealing resin 8.

The tape 2 is made of a material such as polyimide resin. Electrode patterns 10 and bonding pads 12 are provided on a first (upper) surface 2a of the tape 2. Also, the semiconductor chip 4 is mounted on the first surface 2a of the tape 2. In order to provide the electrode patterns 10 and the bonding pads 12, a copper layer is formed on tape 2 and then an etching process is implemented on the copper layer to form predetermined patterns. The electrode patterns 10 and the bonding pads 12 are electrically connected by wiring patterns(not shown).

Also, wires 14 are provided between the semiconductor chop 4 and the bonding pads 12. Accordingly, the semiconductor chip 4 and the electrode patterns 10 are electrically connected via the wires 14, the bonding pads 12 and the wiring patterns. Further tape opening 16 are formed through the tape 2 at positions corresponding to the electrode patterns 10 of the tape 2.

The ball-shaped solder external terminals 6 are provided such that a solder ball parts are on a second (lower) surface 2b of the tape 2. The ball-shaped solder external terminals 6 are provided at positions corresponding to tape openings 16. The ball-shaped solder external terminals 6 are joined to the electrode patterns 10 via the tape openings 16. That is to say, the ball-shaped solder external terminals 6 are joined to the electrode patterns 10 and thus the ball-shaped solder external terminals 6 are attached to the tape 2.

The ball-shaped solder external terminals 6 are joined the electrode patterns 10 in the following manner. First, the tape 2 provided with the electrode patterns 10 and the tape openings 16 is reversed. Then, solder paste 13 is filled in the tape openings 16 (see FIG. 5). Solder balls 6A are placed on the solder paste 13 provided in the tape opening 16. A heat treatment is carried out to fuse the solder balls 6A and the solder paste 13. Then, the fused solder is subjected to a cooling treatment, so that the solder is cured and thus the solder balls 6A are attached to the electrode patterns 10. It is to be noted that the openings 16 are filled with solder.

Thus, with the processes described above, the solder balls 6A are joined to the electrode patterns 10 to for ball-shaped solder external terminal 6. Also, the ball-shaped solder external terminal 6 is shaped such that a portion protruding from the tape opening 16 becomes spherical due to surface tension during the fusing step.

FIGS. 2A to 2C show various steps of mounting the semiconductor device 1 of the above structure onto the mounting board 3. As shown in FIG. 2A, solder paste 19 is provided on lands 17 formed in the mounting board 3, for example, by printing. After registering the ball-shaped solder external terminals 6 and the lands 17, the semiconductor device 1 is placed on the mounting board 3. The solder paste 19 is a mixture of solder particles and a viscous organic agent. The organic agent serves as an adhesive agent to temporarily fix the semiconductor device 1 on the mounting board 3.

Subsequently, the mounting board 3 and the semiconductor device 1 temporarily fixed thereon are subjected to a heat treatment in a reflow oven. Accordingly, the solder particles included in the solder balls 6 and the solder paste 19 are fused, and the organic agent in the solder paste 19 is vaporized. Thus, the ball-shaped solder external terminals 6 and the lands 17 are soldered and the semiconductor device 1 is mounted on the mounting board 3.

In the process of mounting the semiconductor device 1 onto the mounting board 3, there may be a case in which the ball-shaped solder external terminals 6 are not properly joined to the lands 17. This will be described with reference to FIGS. 2A to 2C.

The process of mounting the semiconductor device 1 on to the mounting board 3 has been described above with reference to FIG. 2A. In the process described above, the solder paste 19 is provided on the lands 17. Then, the solder balls 6 and the lands 17 are temporarily fixed by means of the solder paste 19. Thereafter, a reflow process is carried out, so that the solder particles in the solder balls 6 and the solder paste 19 for mounting are fused.

The above described process may be unsuccessful if un appropriate selections are made for the size of the tape openings 16 formed in the tape 2, total amount of the solder, and the size of the lands 17. As shown in FIG. 2B, there may be a case in which most of the solder may flow towards the lands 17 and the ball-shaped solder external terminal 6 is necked within the tape opening 16 (hereinafter referred to as a necking failure). Further, as shown in FIG. 2C, the ball-shaped solder external terminal 6 may be detached from the electrode pattern 10 (hereinafter referred to as an open failure).

If necking failures and/or open failures occur during mounting process of the semiconductor device 1, the mounting reliability will be considerably decreased. Accordingly, in order to detect such failures, it is known to carry out an estimation of the configuration of the ball-shaped solder external terminals for a state after mounting the semiconductor device 1 onto the mounting board 3.

Conventionally, the evaluation of solder external terminals has been carried out by visual inspection or by X-ray photography after actually mounting the semiconductor device 1 onto the mounting board 3. Thus, with the solder shape evaluation method of the related art, the evaluation of the ball-shaped solder external terminals cannot be implemented before the mounting step. If any failure is produced, it is necessary to replace the solder balls 6 by solder balls of different size and then carrying out the mounting and estimation steps again until the size of the solder balls becomes appropriate.

Accordingly, the evaluation method of the related art has a drawback that it is time-consuming to carry out. Also, since the evaluation method is carried out by visual inspection or by X-ray photography, there is a further drawback of low evaluation accuracy.

SUMMARY OF THE INVENTION

Accordingly, it is a general object of the present invention to provide a method of evaluating the configuration of solder external terminals which can obviate the drawbacks described above.

It is another and more specific object of the present invention to provide a method of evaluating the configuration of solder external terminals which can be implemented before a mounting step with improved accuracy and with reduce time.

In order to achieve the above objects according to the present invention, a method is provided for evaluating configuration of solder external terminals of a BGA-type tape-based semiconductor device mounted on a mounting board such that the external terminals are joined to lands provided on the mounting board, the method including the steps of:

a) obtaining geometric data related to openings of a tape substrate of the semiconductor device, solder balls to be placed at positions corresponding to the openings, and the lands of the mounting board; and b) deriving configuration of the solder external terminal based on the geometric data.

With the invention described above, since the estimation is based on known geometric data of the tape openings, solder balls and the lands, the configuration of the solder external terminals can be evaluated without actually mounting the solder balls on the mounting board. Accordingly, the solder balls can be evaluated accurately and with reduced time.

It is yet another object of the present invention to provide a method of evaluating the configuration of solder external terminals which may be applied to a case where voids are produced in the solder external terminals.

In order to achieve the above object, the method further includes the step of calculating the volume of voids to be produced in the external terminals. When deriving configuration of the solder external terminal based on the geometric data, the volume of voids is taken into account to compensate for the geometric data related to the tape substrate.

With the invention described above, the solder external terminals can be accurately evaluated even in a case were voids are produced in the solder external terminals.

The present invention also relates to an apparatus for implementing the method described above. The present invention further relates to a computer readable storage medium with program for implementing the method described above.

Other objects and further features of the present invention will be apparent from the following detailed description when read in conjunction with the accompanying drawings.

BRIEF DESCRIPTION OF THE DRAWINGS

FIG. 1 is a cross-sectional diagram showing a part of a semiconductor device which can be used in the method of the present invention.

FIG. 9 is a diagram showing a map used in step 15 of the flowchart shown in FIG. 4.

DETAILED DESCRIPTION OF THE PREFERRED EMBODIMENTS

Figure 2A:
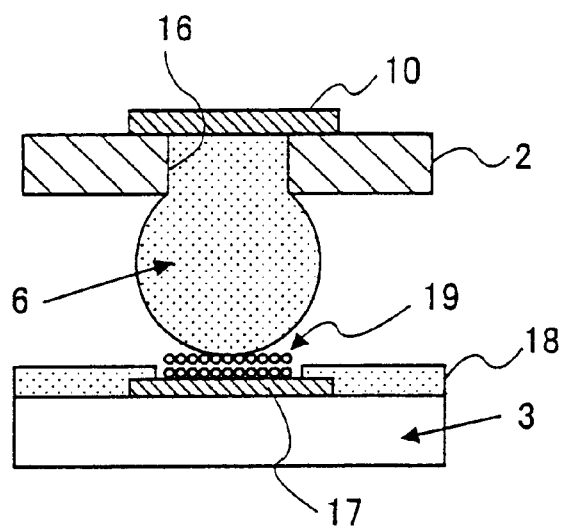
FIGS. 2A to 2C are diagrams showing how connection failure of the solder is caused.
Figure 2B:
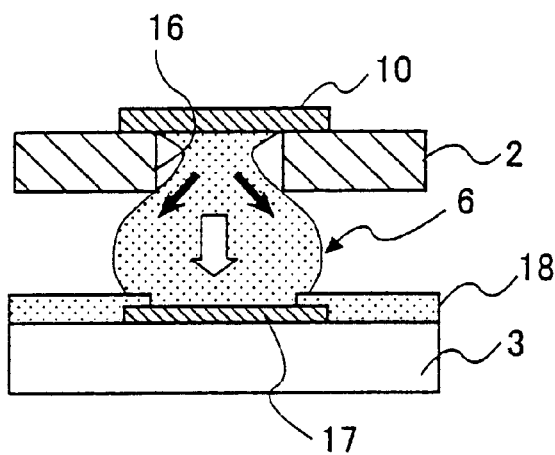
Figure 2C:
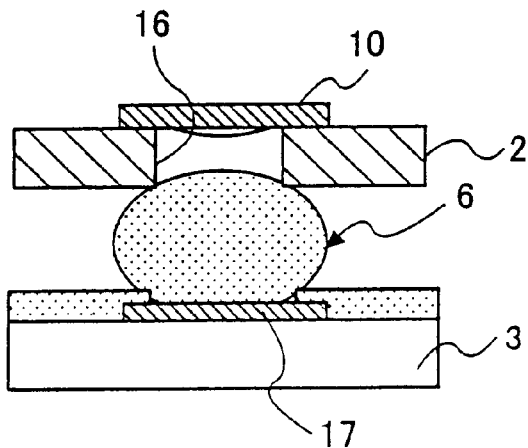

In the following, principles and embodiments of the present invention will be described with reference to the accompanying drawings. In the following description, like reference numerals are used to indicate like elements through out the Figures.

Figure 3:
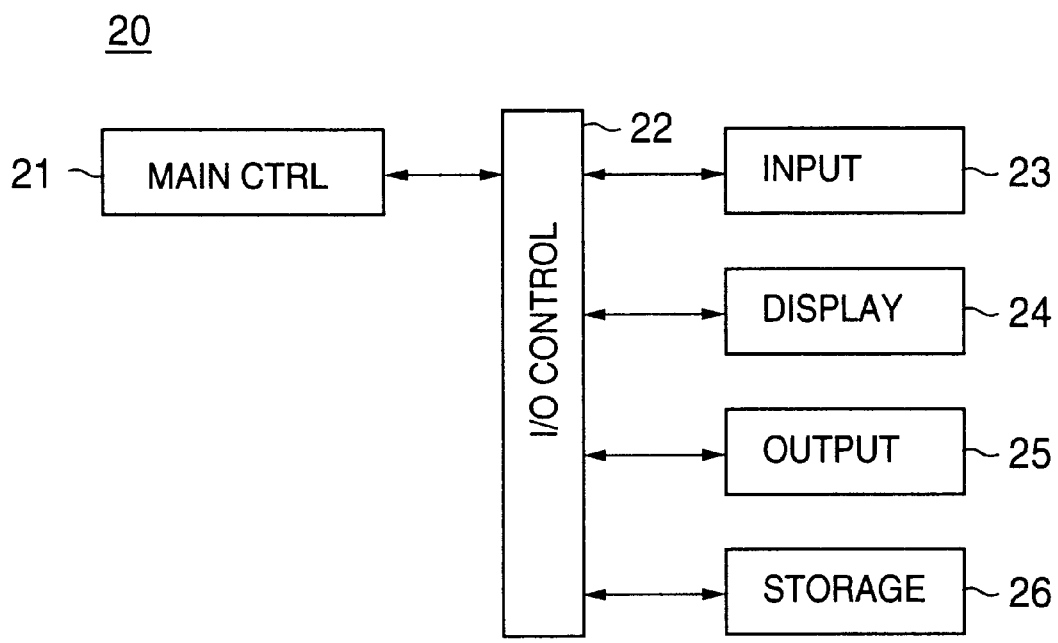
FIG. 3 is a block diagram showing an apparatus of the present invention.

FIG. 3 is a block diagram showing a solder shape evaluation apparatus 20 which may be used during BGA mounting. The solder shape evaluation apparatus 20 includes a main control part 21, an input/output control part 22, a display unit 24, an output unit 25 and a storage unit 26.

The main control part 21 is embodied as a microcomputer and implements a solder shape evaluation process in accordance with a solder shape evaluation program stored in the storage unit 26. The input/output unit 22 controls information communication between the units 23 to 26 (to be described later) and the main control part 21. The input unit 23 may be, for example, a keyboard via which various parameters required for solder shape evaluation process are input.

The display unit 24 may be, for example, a CRT on which various information required for input/output process of the various parameters and for solder shape evaluation process are displayed. The output unit 25 may be, for example, a printer with which the result of solder shape evaluation process is printed out. Further, the storage unit 26 stores the solder shape evaluation program shown in FIG. 4 and a two-dimensional map showing a relationship between solder shape determining value and tape thickness (see FIG. 9), etc.

It is to be noted that the solder shape evaluation program (FIG. 4) is stored in the storage medium according to the present invention and the storage unit 26 stores the solder shape evaluation program read out from the storage medium.

Referring to FIGS. 4 to 9, the solder shape evaluation process will be described which is implemented by the main control part 21 and in accordance with the solder shape evaluation program.

Figure 4:
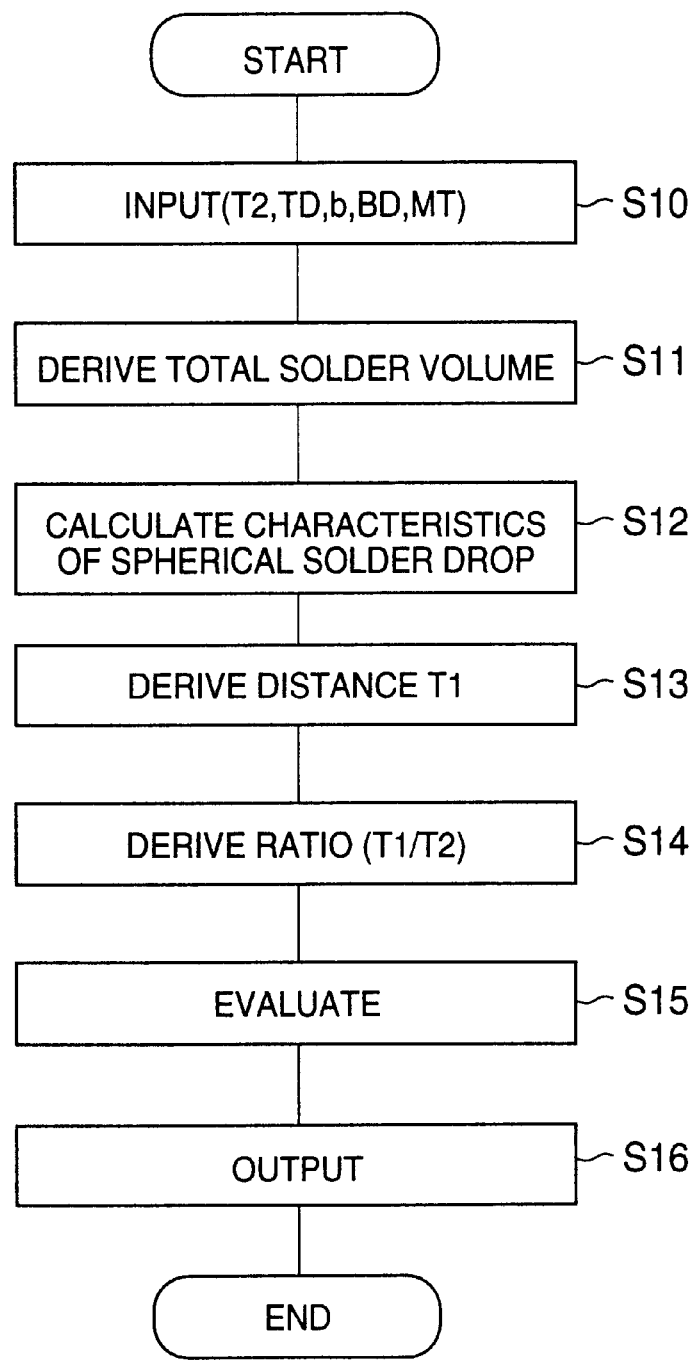
FIG. 4 is a flowchart showing various steps of a method of the present invention.

When the solder shape evaluation process of FIG. 4 is initiated, an operator of the solder shape evaluation apparatus 20 inputs various parameters through the input unit 23 (step 10 (S10)). The parameters inputted at step 10 are thickness of the tape 2 (tape thickness) T2, diameter of the tape opening 16 (tape opening diameter) TD, radius of the land 17 formed on the mounting board 3 (land radius) b, radius of the solder ball 6A (solder ball radius) BD and thickness of the solder paste 19 (paste thickness) MT.

The input parameters T2, TD, b, BD and MT are known before actually mounting the solder balls 6 on the mounting board 3. The input parameters T2, TD, b, BD and MT are transmitted to the main control part 21 via the input/output control part 22.

Figure 5:
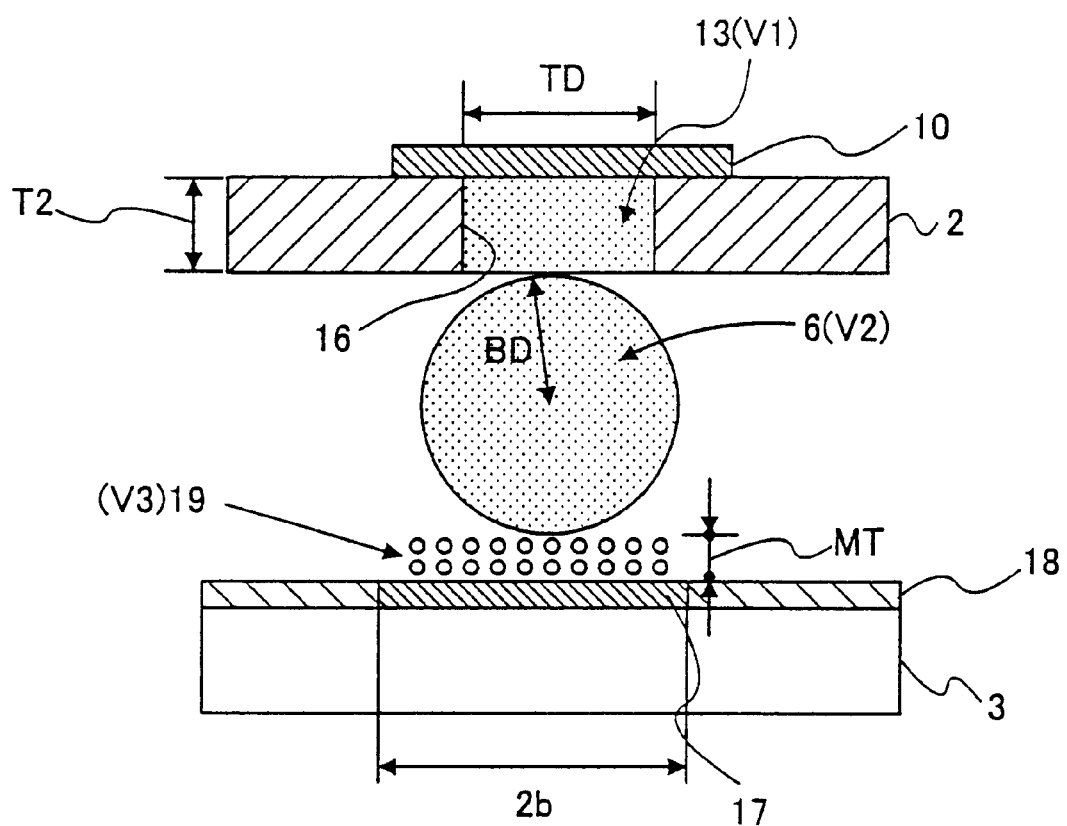
FIG. 5 is a schematic diagram illustrating step 11 of the flowchart shown in FIG. 4.

After step 10, the main control part 21 calculates total solder volume V based on the input parameters T2, TD, b, BD and MT (step 11). As shown in FIG. 5, the total solder volume V is given as a sum of three sub-volumes V1, V2 and V3. First sub-volume V1 is a volume of solder included in the solder paste 13 that fills the tape opening 16. Second sub-volume V2 is a volume of solder of the solder ball 6A. Third sub-volume V3 is a volume of solder included in the solder paste 19 provided on the land 17. Thus, the total volume V may be expressed as (V1+V2+V3).

Each of the sub-volumes V1, V2 and V3 may be derived by the following equations:

$$V1 = (TD^2 \times T2 \times \pi)/4 \quad (1)$$

$$V2 = (BD^3 \times \pi)/6 \quad (2)$$

$$V3 = (b^2 \times MT \times \pi)/4 \quad (3)$$

Therefore, the total solder volume V may be expressed as:

$$V \times \{(TD^2 \times T2 \times \pi)/4\} + \{(BD^3 \times \pi)/6\} + \{(b^2 \times MT \times \pi)/4\} \quad (4)$$

In the following description, it is assumed that the radius of the solder paste 19 and the radius of the land b are equal.

At step 12, the height and the contact angle of a spherical solder drop are calculated at the main control part 21. In the present application, the spherical solder drop refers to a drop of solder that is formed when the total solder volume V is fused and joined to the land 17.

Figure 6:
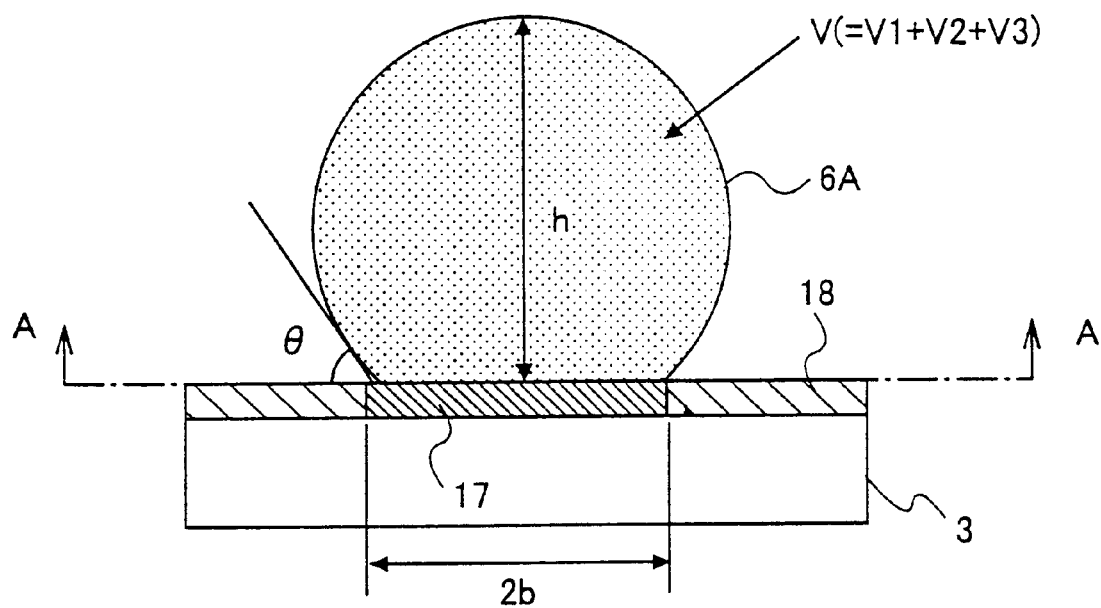
FIG. 6 is a schematic diagram illustrating step 12 of the flowchart shown in FIG. 4.

FIG. 6 is a diagram showing the spherical solder drop. As shown in FIG. 6, the spherical solder drop conforms to the shape of the configuration of the land 17 at a portion joined to the land 17. That is to say, when viewed along line A—A, the spherical solder drop is circular at the joining portion. Above the joining portion, the spherical solder drop has a configuration that is substantially spherical due to surface tension. In the following description, the solder having the shape of a spherical solder drop is referred to as a drop-shaped solder 6A.

The volume V of the spherical can also be defined by the height of the spherical solder drop "h" and the contact angle "θ" between the spherical solder drop and the land 17 at the peripheral part of the contact portion. The volume of the spherical solder drop is defined by the following equation:

$$V = \frac{1}{6}\pi h(h^2 + 3b^2) \quad (5)$$

Then, the height h can be derived by the following equation:

$$h = \left(\frac{3V}{\pi} + \sqrt{\left(\frac{3V}{\pi}\right)^2 + b^6}\right)^{1/3} + \left(\frac{3V}{\pi} - \sqrt{\left(\frac{3V}{\pi}\right)^2 + b^6}\right)^{1/3} \quad (6)$$

The contact angle θ can be derived by the following equation:

$$\tan\theta = \frac{2b(j+k)}{3b^2 - j^2 - k^2}$$

where $h = j + k$.

At step 13, the height T1 of the spherical solder drop within the tape opening is calculated based on the height h and the contact angle θ. Firstly, a position is derived where the diameter of a circle on a horizontal plane traversing the spherical solder drop is equal to the tape opening diameter TD. This position is referred to as an equal diameter level. Then, the height T1, which is a distance between the equal diameter level and the highest point of the spherical solder drop, is determined.

Figure 7:
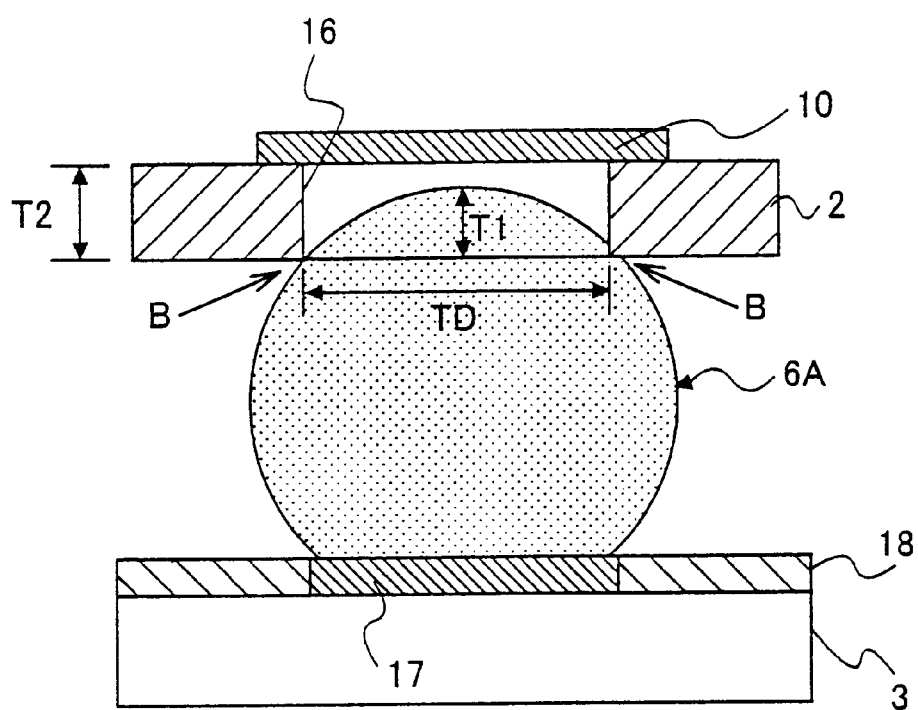
FIG. 7 is a schematic diagram illustrating step 13 of the flowchart shown in FIG. 4.

Referring to FIGS. 6 and 7, the process implemented in step 13 will be described. The equal diameter level corresponds to a position where the periphery of the tape opening 16 comes in contact (shown by arrows B) with the drop shaped solder 6A when the tape 2 having the tape opening 16 of diameter Td is covered on the drop shaped solder 6A (see FIG. 7). Therefore, step 13 corresponds to a process of deriving the distance T1 between the contact position and the highest point of the drop shaped solder 6A in a vertical direction.

Since the equations defining the spherical shape of the drop shaped solder 6A can be easily derived and the diameter TD of the tape opening 16 is known, coordinates of the position shown by the arrows B in FIG. 7 can be derived easily. Accordingly, the distance T1 between the position B and the highest point of the drop shaped solder 6A can also be derived easily.

In step 14, a ratio between the distance T1 and the tape thickness T2 is derived. The ratio between the distance T1 and the tape thickness T2 is hereinafter referred to as a tape thickness ratio (T1/T2).

Figure 8:
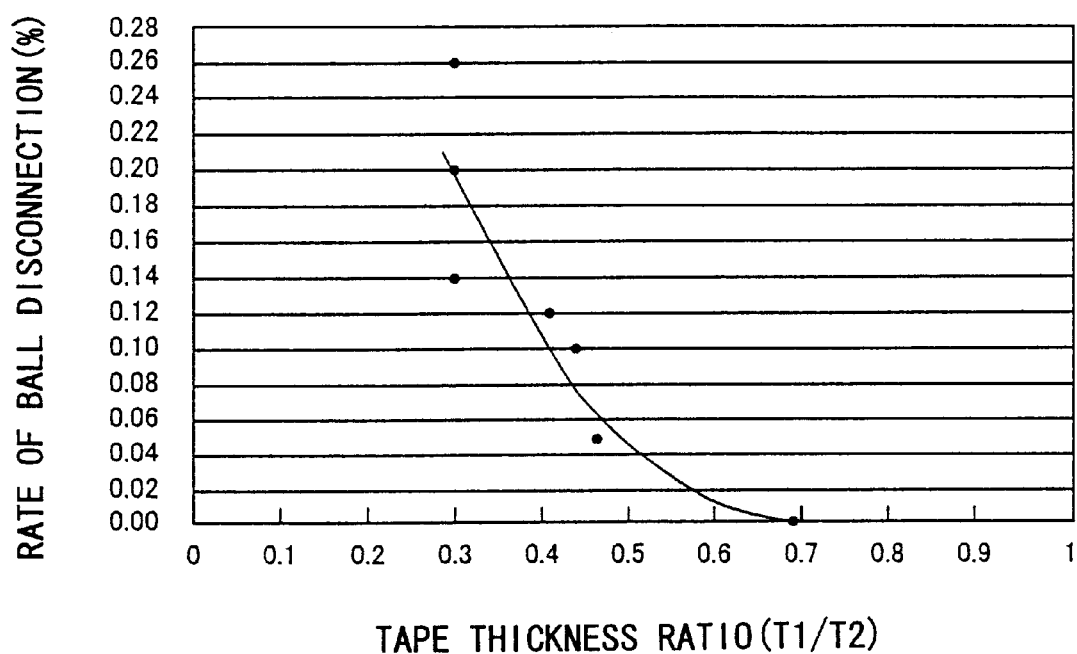
FIG. 8 is a graph of ball fall-off occurrence rate against tape thickness ratio (T1/T2).

The inventors have carried out an experiment to derive a relationship between the tape thickness ratio (T1/T2) and a rate of occurrence of open failure (rate of occurrence of ball disconnection). The experiment was carried out using the semiconductor device 1 of a mass-produced type. Various semiconductor devices 1 with different tape thickness ratio (T1/T2) were mounted on the mounting board and the rate of occurrence of ball-dropping was derived. FIG. 8 is a graph showing the result of the experiment. In FIG. 8, the vertical axis represents the rate of occurrence of ball-dropping and the horizontal axis represents the tape thickness ratio.

It can be seen from FIG. 8 that a slight ball-dropping occurs at a tape thickness ratio of 0.7, and the rate of occurrence of ball-dropping increases as the tape thickness ratio decreases. That is to say, the occurrence of ball-dropping (or, the shape of solder) can be estimated by the tape thickness ratio.

FIG. 9 shows a two-dimensional map of a solder shape evaluation with respect to the tape thickness ratio. The map shown in FIG. 9 is created from the results of experiment shown in FIG. 8. In the present embodiment, a grade AA is given for a case where (T1/T2) 1.0, since no ball-dropping occurs due to the defectiveness of the solder shape as shown in FIG. 8. A grade D is given for a case where (T1/T2)<0.3, since a considerable number of ball-dropping occurs due to frequent occurrence of the defectiveness of the solder shape as shown in FIG. 8. Between grade AA and grade D, three grades A to C are provided. The solder shape evaluation indicated by grades AA to D can be obtained from the two-dimensional map shown in FIG. 9 by taking the tape thickness parameter (T1/T2) as a parameter.

In step 15, the main control part 21 accesses the two-dimensional map (see FIG. 9) stored in the storage unit 26, so as to select the grade corresponding the tape thickness ratio (t1/T2) that is in interest. The result of the solder shape evaluation of step 15 is displayed on the output unit 25 and is also outputted from the output unit 25. Accordingly, the solder shape evaluation process of FIG. 4 terminates.

As has been described above, in the solder shape evaluation process of the present invention, the solder shape is estimated by predetermined operations based on parameters such as the total solder volume V, the land radius b, and the opening diameter TD, all of which being measurable in advance. Accordingly, the solder shape can be estimated before the mounting process accurately within a reduced time. Also, it is now possible in a designing step to estimate the occurrence of failures, such has open failures and necking failures, that may occur during the mounting process. Therefore, the semiconductor device 1 having a high reliability and without any necking failures can be provided in the designing step.

Referring now to FIGS. 10A to 10D, another aspect of the present invention will be described. It is known that voids (air bubbles) may be produced in the solder external terminals 6. When voids are produced in the solder external terminal 6, the probability of occurrence of open failures and necking failures increases.

Figure 10A:
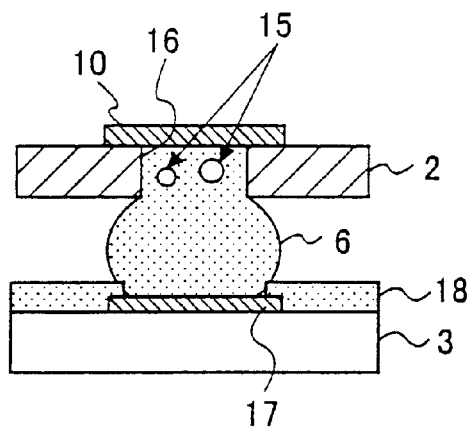
FIGS. 10A to 10D are diagrams showing how connection failure of the solder is caused when there are voids in the solder.
Figure 10B:
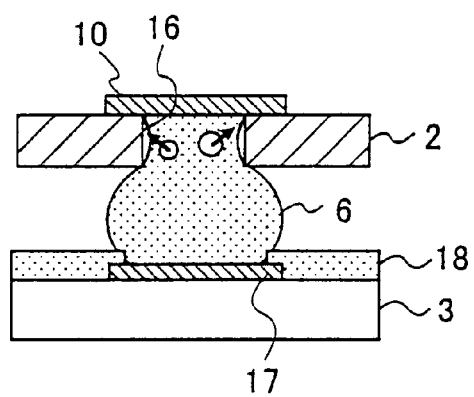

FIGS. 10A to 10D show states where the solder external terminals 6 with voids 15 is mounted on the mounting board 3. As shown in FIG. 10A, the voids 15 may exist in the solder external terminal 6. Then, when a heat treatment applied by a reflow process, the solder external terminals 6 and the solder paste 19 will fuse. Then, as shown in FIG. 10B, the voids 15 or the bubbles starts moving upwards within the fused solder.

Figure 10C:
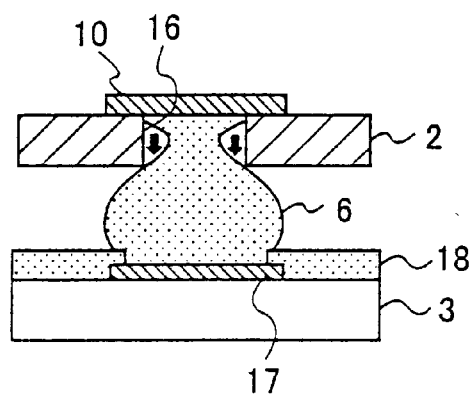
Figure 10D:
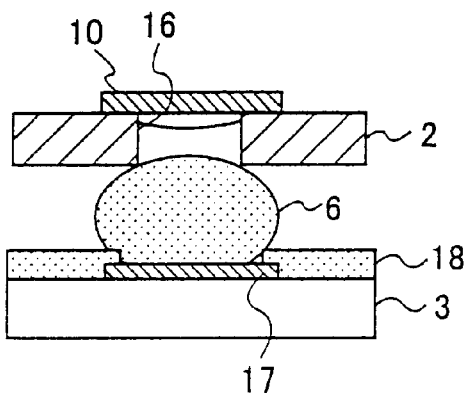

Then, the voids 15 are expelled from the solder external terminal 6 and the air remains within the tape opening 16. Therefore, as shown in FIG. 10C, the gap in the tape opening 16 increases and the solder external terminal 6 will be pressed downwards. That is to say, since the voids 15 are expelled and the air remains in the tape opening 16, the solder external terminal 6 will be in a more necked state inside the tape opening 16. Accordingly, when the voids 15 exist in the solder external terminal 6, the rate of occurrence of the open failures and the necking failures will increase.

Therefore, in order to implement an accurate solder shape evaluation, the effect of the voids 15 should be taken into account.

In order to reflect the effect of the voids, the volume of the voids (v4) that may occur in the solder external terminal 6 is derived in advance. The number of voids to occur and the volume of the voids are known experimentally and thus are known values. Also, for increased accuracy, the volume V4 of the voids 15 may be directly obtained by implementing an X-ray imaging of the solder external terminal 6.

Thus obtained volume V4 of the voids 15 is used in step 14 of FIG. 4 to compensate for the thickness (T2) of the substrate. That is to say, when the voids 15 are expelled inside the tape opening 16, the gap within the tape opening 16 increases as compared to a case where there is no void 15.

Figure 11:
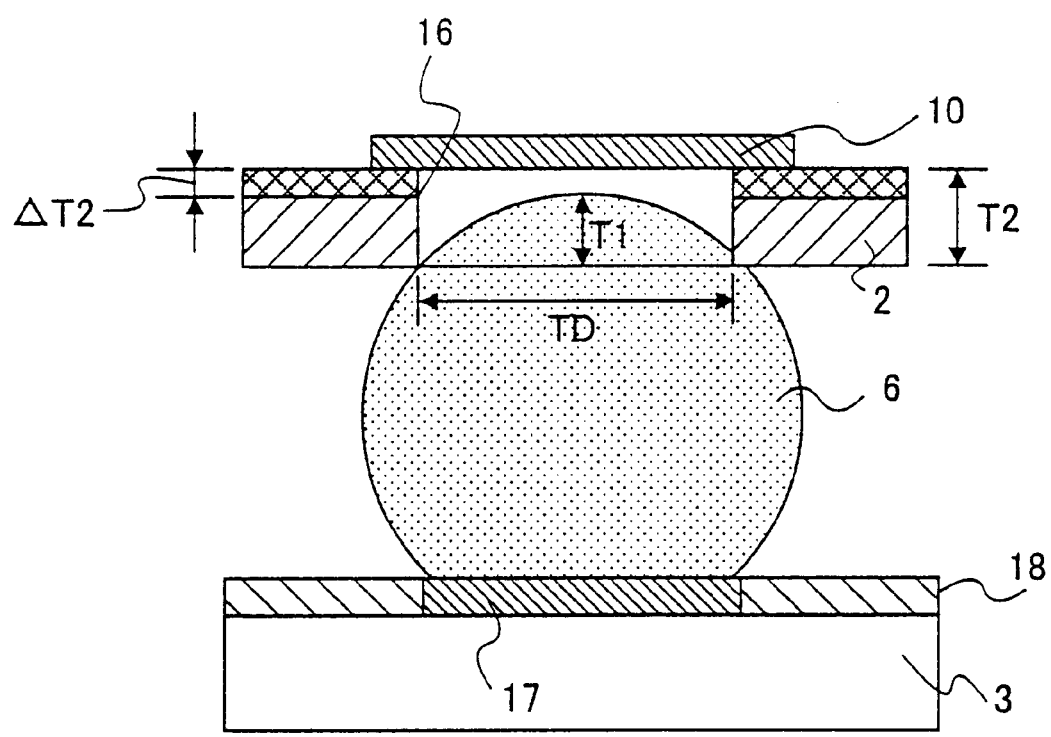
FIG. 11 is a schematic diagram showing how the method of the present invention is carried out when there are voids in the solder.

Therefore, as shown in FIG. 11, it can be regarded that the height of the tape opening (or the tape thickness T1) is increased ($\Delta$T2) by an amount corresponding to the volume V4 of the voids 15. Then, even if voids 15 exist in the solder external terminal 6, the solder shape evaluation may be implemented using the two-dimensional map of FIG. 9. $\Delta$T2 may be shown by the following expression:

$$\Delta T2 = (4 \times V4)/(TD^2 \times \pi) \tag{8}$$

Accordingly, since the voids 15 existing in the solder external terminal 6 are taken into account by compensating for the tape thickness T2, the solder shape evaluation can be accurately implemented even if the voids 15 exist in the solder external terminal 6.

It is to be noted that, in the embodiment described above, the solder shape evaluation is based on the tape thickness ratio (T1/T2), but the solder shape can also be estimated based on a volume ratio. The volume ratio is defined as a ratio of the volume V1 of a part of drop-shaped solder 6A that is above a level shown by line B—B in FIG. 7 against the volume V2 of the tape opening (V1/V2). The volume V1 of the drop-shaped solder 6A and the volume V2 of the tape opening 16 may be derived by the following equations, respectively:

$$V_1 = \int_{H-TT(l)}^{H} X^2 dy \tag{9}$$

$$= \int_{H-TT(l)}^{H} \{R^2 - (Y-b)^2\} dy$$

$$V_2 = \frac{TAPE(2, l)^2 \times TAPE(1, l)}{4}\pi \tag{10}$$

Further, the present invention is not limited to these embodiments, but variations and modifications may be made without departing from the scope of the present invention.

The present application is based on Japanese priority application No. 2000-350221 filed on Nov. 16, 2000, the entire contents of which are hereby incorporated by reference.

What is claimed is:

1. A method of evaluating configuration of solder external terminals of a BGA-type tape-based semiconductor device mounted on a mounting board such that said external terminals are joined to lands provided on said mounting board, comprising the steps of:
   a) deriving total solder volume of said solder external terminal by summing volumes of solder paste filled in an opening of a tape substrate, a solder ball and solder paste provided on said land;
   b) calculating parameters characterizing a spherical solder drop based on said total solder volume and a radius of said land;
   c) deriving a level where a diameter of a circle on a horizontal plane traversing said spherical solder drop is equal to a diameter of said opening of the tape substrate and thus deriving a distance between said level and the highest point of the spherical solder drop;

d) deriving a ratio of a thickness of said tape substrate to said distance; and e) evaluating said configuration of solder external terminals based on said ratio.

2. The method as claimed in claim 1, further comprising the step of:

f) deriving a volume of voids to be produced in said solder external terminal; and g) compensating for the thickness of said tape substrate based on said volume of voids, wherein said steps f) and g) are implemented at least before said step d).

3. The method as claimed in claim 1, wherein said step e) is carried out using a two-dimensional map including said ratio that are experimentally obtained in advance and a possibility of occurrence of failure associated with said ratio.

4. A computer readable medium storing program code for causing a computer to evaluate configuration of solder external terminals of a BGA-type tape-based semiconductor device mounted on a mounting board such that said external terminals are joined to lands provided on said mounting board, comprising:

first program code means for deriving total solder volume of said solder external terminal by summing volumes of solder paste filled in an opening of a tape substrate, a solder ball and solder paste provided on said land;

second program code means for calculating parameters characterizing a spherical solder drop based on said total solder volume and a radius of said land;

third program code means for deriving a level where a diameter of a circle on a horizontal plane traversing said spherical solder drop is equal to a diameter of said opening of the tape substrate and thus deriving a distance between said level and the highest point of the spherical solder drop;

fourth program code means for deriving a ratio of a thickness of said tape substrate to said distance; and fifth program code means for evaluating said configuration of solder external terminals based on said ratio.

5. The computer readable medium as claimed in claim 4, further comprising:

sixth program code means for deriving a volume of voids to be produced in said solder external terminal; and seventh program code means compensating for the thickness of said tape substrate based on said volume of voids, wherein said steps sixth and seventh program code means are executed at least before said fourth program code means.

6. An apparatus for evaluating configuration of solder external terminals of a BGA-type tape-based semiconductor device mounted on a mounting board such that said external terminals are joined to lands provided on said mounting board, said apparatus comprising:

an input unit which receives a first parameter representing a thickness of a tape substrate, a second parameter representing a diameter of openings of said tape substrate, a third parameter representing a radius of said land, a fourth parameter representing a radius of a solder ball, a fifth parameter representing a thickness of solder paste provided on said land;

a storage unit for storing a program for carrying out various calculations to derive the configuration of solder external terminal;

a processing unit which executes said program to derive solder configuration based on said first to fifth parameters;

a display unit for displaying various information required for operations of said input unit and said processing unit; and an output unit for outputting the result of the evaluation of said configuration of said solder external terminals.

7. A method of evaluating solder connections in a BGA-type tape-based semiconductor device, comprising:

inputting parameters related to the tape and a solder ball into an input unit;

calculating a solder volume based upon the parameters by a processor;

determining a solder drop based upon a height (h) of the solder ball and of an angle Θ between the solder drop and a land;

determining a distance T1, wherein said distance T1 is the distance between the diameter level of the tape opening and the top of the solder drop based on the solder volume and the height and angle Θ using the processor;

determining a tape thickness ratio, wherein the tape thickness ratio is the distance T1 divided by the tape thickness T2; and selecting an optimal tape thickness ratio (T1/T2) and a corresponding solder volume for the solder ball that prevents the solder drop.

8. The method as recited in claim 7, further comprising:

determining a volume of air bubbles formed in the solder ball based on the parameters; and adjusting the optimal tape thickness ratio (T1/T2) to compensate for the air bubbles.

9. The method as recited in claim 7, wherein the parameters comprise a tape thickness (T2), a tape opening diameter (TD), a land radius (b), a solder ball radius (BD) and a paste thickness (MT).

10. The method as recited in claim 9, wherein the volume of the solder ball is computed utilizing the formula, Volume of the solder ball=$\{(TD^2*T2*\pi)/4\}+\{(BD^3*\pi)/6\}+\{(b^2*MT*\pi)/4\}$.

11. A device for evaluating solder connections in a BGA-type tape-based semiconductor device, comprising:

an input unit to receive parameters related to the tape and a solder ball;

a storage unit to store a table having an optimal tape thickness ratio (T1/T2) and a corresponding solder volume for the solder ball; and a processor to calculate a solder volume based upon the parameters, a solder drop based upon height (h) of a solder ball and an angle Θ between the solder drop and a land, distance T1, a tape thickness ratio, wherein the tape thickness ratio is the distance T1 divided by the tape thickness T2, and to select an optimal tape thickness ratio (T1/T2) and a corresponding solder volume for the solder ball that prevents the solder drop, wherein said distance T1 is the distance between the diameter level of the tape opening and the top of the solder drop based on the solder volume, the height and angle Θ.

12. The device as recited in claim 11, wherein the processor further determines a volume of air bubbles formed in the solder ball based on the parameters and adjusts the optimal tape thickness ratio (T1/T2) to compensate for the air bubbles.

13. The device as recited in claim 11, wherein the parameters comprise a tape thickness (T2), a tape opening diameter (TD), a land radius (b), a solder ball radius (BD) and a paste thickness (MT).

14. The device as recited in claim 13, wherein the processor computes the volume of the solder ball utilizing the formula Volume of the solder ball=$\{(TD^2*T2*\pi)/4\}+\{(BD^3*\pi)/6\}+\{(b^2*MT*\pi)/4\}$.

* * * * *